(12) United States Patent
Hashemi et al.

(10) Patent No.: US 11,915,734 B2
(45) Date of Patent: *Feb. 27, 2024

(54) SPIN-ORBIT-TORQUE MAGNETORESISTIVE RANDOM-ACCESS MEMORY WITH INTEGRATED DIODE

(71) Applicant: International Business Machines Corporation, Armonk, NY (US)

(72) Inventors: Pouya Hashemi, Purchase, NY (US); Takashi Ando, Eastchester, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 336 days.

This patent is subject to a terminal disclaimer.

(21) Appl. No.: 17/401,383

(22) Filed: Aug. 13, 2021

(65) Prior Publication Data

US 2023/0050152 A1 Feb. 16, 2023

(51) Int. Cl.
*G11C 11/00* (2006.01)
*G11C 11/18* (2006.01)
*G11C 11/16* (2006.01)
*H10B 61/00* (2023.01)
*H10N 50/10* (2023.01)
(Continued)

(52) U.S. Cl.
CPC ............ *G11C 11/18* (2013.01); *G11C 11/161* (2013.01); *G11C 11/1673* (2013.01); *G11C 11/1675* (2013.01); *H10B 61/10* (2023.02); *H10B 61/20* (2023.02); *H10N 50/10* (2023.02);
(Continued)

(58) Field of Classification Search
CPC ... G11C 11/18; G11C 11/161; G11C 11/1673; G11C 11/1675
See application file for complete search history.

(56) References Cited

U.S. PATENT DOCUMENTS 1,063,430 A 6/1913 Grahl
6,750,540 B2 6/2004 Kim
(Continued)

FOREIGN PATENT DOCUMENTS

CN 109643567 A 4/2019
CN 110660435 A 1/2020
(Continued)

OTHER PUBLICATIONS

U.S. Appl. No. 17/401,415, filed Aug. 2021, Evarts et al.*
(Continued)

*Primary Examiner* — Pho M Luu
(74) *Attorney, Agent, or Firm* — David K. Mattheis

(57) ABSTRACT

A spin-orbit torque magnetoresistive random-access memory device formed by fabricating a spin-Hall-effect (SHE) layer above and in electrical contact with a transistor, forming a spin-orbit-torque (SOT) magnetoresistive random access memory (MRAM) cell stack disposed above and in electrical contact with the SHE rail, wherein the SOT-MRAM cell stack comprises a free layer, a tunnel junction layer, and a reference layer, forming a cylindrical diode structure above and in electrical contact with the SOT-MRAM cell stack, forming a write line disposed in electrical contact with the SHE rail, and forming a read line disposed above and adjacent to an outer cylindrical electrode of the diode structure.

20 Claims, 17 Drawing Sheets

(51) Int. Cl.
*H10N 50/85* (2023.01)
*H10N 52/01* (2023.01)
*H10N 52/80* (2023.01)

(52) U.S. Cl.
CPC ............ *H10N 50/85* (2023.02); *H10N 52/01* (2023.02); *H10N 52/80* (2023.02)

(56) References Cited

U.S. PATENT DOCUMENTS

| | | | |
|---|---|---|---|
| 9,269,415 B1 | 2/2016 | Liu | |
| 9,570,137 B2 | 2/2017 | Sugiyama | |
| 9,830,968 B2 | 11/2017 | Shimomura | |
| 10,193,061 B2 | 1/2019 | Shiokawa | |
| 10,205,088 B2 | 2/2019 | Sasaki | |
| 10,319,901 B2 | 6/2019 | Sasaki | |
| 10,374,151 B2 | 8/2019 | Komura | |
| 10,381,060 B2 | 8/2019 | Kan | |
| 10,396,276 B2 | 8/2019 | Sasaki | |
| 10,418,545 B2 | 9/2019 | Sasaki | |
| 10,438,641 B2 | 10/2019 | Sasaki | |
| 10,439,130 B2 | 10/2019 | Sasaki | |
| 10,454,023 B2 | 10/2019 | Tang | |
| 10,468,456 B2 * | 11/2019 | Jacob | H10N 50/80 |
| 10,490,249 B2 | 11/2019 | Sasaki | |
| 10,490,601 B2 | 11/2019 | Braganca | |
| 10,529,914 B2 | 1/2020 | Kakinuma | |
| 10,580,470 B2 | 3/2020 | Shiokawa | |
| 10,593,388 B2 | 3/2020 | Shiokawa | |
| 10,593,868 B2 | 3/2020 | Shiokawa | |
| 10,622,048 B2 | 4/2020 | Shiokawa | |
| 10,644,228 B2 | 5/2020 | Sasaki | |
| 10,651,366 B2 | 5/2020 | Shiokawa | |
| 10,665,375 B2 | 5/2020 | Ota | |
| 10,741,318 B2 | 8/2020 | Ishitani | |
| 10,748,563 B2 | 8/2020 | Sasaki | |
| 10,756,262 B2 | 8/2020 | Komura | |
| 10,762,941 B2 | 9/2020 | Shiokawa | |
| 10,763,430 B2 | 9/2020 | Shiokawa | |
| 10,770,214 B2 | 9/2020 | Shiokawa | |
| 10,797,231 B2 | 10/2020 | Sasaki | |
| 10,840,002 B2 | 11/2020 | Sasaki | |
| 10,854,258 B2 | 12/2020 | Shiokawa | |
| 10,861,523 B2 | 12/2020 | Sasaki | |
| 10,892,400 B2 | 1/2021 | Noh | |
| 10,902,987 B2 | 1/2021 | Sasaki | |
| 10,910,554 B2 | 2/2021 | Sasaki | |
| 10,943,631 B2 | 3/2021 | Sasaki | |
| 10,944,045 B2 | 3/2021 | Sasaki | |
| 10,971,229 B2 | 4/2021 | Jaiswal | |
| 10,971,293 B2 | 4/2021 | Sasaki | |
| 10,998,493 B2 | 5/2021 | Komura | |
| 11,004,479 B2 | 5/2021 | Bhargava | |
| 11,004,490 B2 | 5/2021 | Sakhare | |
| 11,289,538 B2 * | 3/2022 | Ying | H10N 50/01 |
| 2008/0186759 A1 | 8/2008 | Shimizu | |
| 2015/0109849 A1 | 4/2015 | Tsai | |
| 2015/0263069 A1 | 9/2015 | Jo | |
| 2017/0092842 A1 | 3/2017 | Khalili Amiri | |
| 2017/0117027 A1 | 4/2017 | Braganca | |
| 2018/0061467 A1 | 3/2018 | Kan | |
| 2020/0098822 A1 | 3/2020 | Toh | |
| 2020/0235288 A1 | 7/2020 | Ikegawa | |
| 2020/0235289 A1 | 7/2020 | Alam | |
| 2020/0350364 A1 | 11/2020 | Wan | |
| 2021/0020695 A1 | 1/2021 | Bak | |
| 2021/0134339 A1 | 5/2021 | Song | |
| 2021/0257543 A1 | 8/2021 | Wu | |
| 2021/0375342 A1 | 12/2021 | Sun | |
| 2022/0199685 A1 | 6/2022 | Wan | |
| 2022/0199686 A1 | 6/2022 | Wan | |
| 2022/0223649 A1 | 7/2022 | Wan | |
| 2022/0223650 A1 | 7/2022 | Katine | |
| 2023/0049812 A1 | 2/2023 | Worledge | |
| 2023/0050152 A1 | 2/2023 | Hashemi | |
| 2023/0065109 A1 | 3/2023 | Dellinger | |
| 2023/0065198 A1 * | 3/2023 | Young | G11C 11/1675 |
| 2023/0089984 A1 | 3/2023 | Wu | |

FOREIGN PATENT DOCUMENTS

| | | | |
|---|---|---|---|
| CN | 111740011 A | 10/2020 | |
| CN | 112420096 A | 2/2021 | |
| WO | 2020131893 A2 | 6/2020 | |
| WO | 20200131893 W | 6/2020 | |
| WO | 2020192201 A1 | 10/2020 | |

OTHER PUBLICATIONS

International Search Report and Written Opinion dated Oct. 26, 2022 from International Application No. PCT/IB2022/056619 dated Jul. 19, 2022.

IBM Appendix P, "List of patent and patent applications treated as related", Filed Aug. 13, 2021, 2 pages.

Kim et al., "Multilevel Spin-Orbit Torque MRAMs," in IEEE Transactions on Electron Devices, vol. 62, No. 2, pp. 561-568, Feb. 2015, doi: 10.1109/TED.2014.2377721.

Seo et al., "Area-Efficient SOT-MRAM With a Schottky Diode", IEEE Electron Device Letters, vol. 37, No. 8, Aug. 2016, 4 pps.

U.S. Appl. No. 17/401,415, filed Aug. 13, 2021.
U.S. Appl. No. 17/401,394, filed Aug. 13, 2021.

* cited by examiner

SPIN-ORBIT-TORQUE MAGNETORESISTIVE RANDOM-ACCESS MEMORY WITH INTEGRATED DIODE

BACKGROUND

The disclosure relates generally to magnetoresistive random-access memory (MRAM). The disclosure relates particularly to spin-orbit torque MRAM structures integrated with a diode.

MRAM is a type of solid state, non-volatile memory that uses tunneling magnetoresistance (TMR) to store information. MRAM is made up of an electrically connected array of magnetoresistive memory elements, referred to as magnetic tunnel junctions (MTJs). Each MTJ includes a free layer and fixed layer that each include a layer of a magnetic material, and that are separated by a non-magnetic insulating tunnel barrier. The free layer has a variable magnetization direction, and the fixed layer has an invariable magnetization direction. An MTJ stores information by switching the magnetization state of the free layer. When the magnetization direction of the free layer is parallel to the magnetization direction of the fixed layer, the MTJ is in a low resistance state. Conversely, when the magnetization direction of the free layer is antiparallel to the magnetization direction of the fixed layer, the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM. MRAM cells can be formed as a vertical stack enabling device design options for increasing device memory cell element density while maintaining or even reducing the scale of devices.

Spin-orbit-torque (SOT) MRAM cells include a spin-orbit torque, or spin-Hall-effect (SHE), layer in contact with the magnetic tunnel junction (MTJ) structure of the MRAM. The SHE is typically a heavy conductive metal, such as platinum or tantalum. Current is passed through the SHE layer, but not through the MTJ structure, to write to the cell and current is passed through the MTJ to read the cell. Since high voltage write energies are not passed though the MTJ of the MRAM cell, SOT MRAM tend to be more reliable and have a longer lifecycle. Less energy is used in writing the SOT MRAM, as the write energy does not pass through the MTJ. Passing the write current through the SHE layer, and not through the MTJ structure, also yields fewer writing errors, and higher writing speeds—further reducing the energy needed per write operation.

Control of read and write functions for a standard SOT-MRAM cell includes a first transistor controlling the read current through the cell and a second transistor controlling the write current through the SHE line of the cell. The relevant circuit die area for such SOT-MRAM cells therefore includes the cell and the two control transistors.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a spin-orbit torque magnetoresistive random-access memory device formed by fabricating a spin-Hall-effect (SHE) layer above and in electrical contact with a transistor, forming a spin-orbit-torque (SOT) magnetoresistive random access memory (MRAM) cell stack disposed above and in electrical contact with the SHE rail, wherein the SOT-MRAM cell stack comprises a free layer, a tunnel junction layer, and a reference layer, forming a cylindrical diode structure above and in electrical contact with the SOT-MRAM cell stack, forming a write line disposed in electrical contact with the SHE rail, and forming a read line disposed above and adjacent to an outer cylindrical electrode of the diode structure.

In one aspect, a spin-orbit torque magnetoresistive random-access memory device including a spin-Hall-effect (SHE) rail, a spin-orbit-torque (SOT) magnetoresistive random access memory (MRAM) cell stack disposed above and in electrical contact with the SHE rail, wherein the SOT-MRAM cell stack comprises a free layer, a tunnel junction layer, and a reference layer, a cylindrical diode structure disposed above and in electrical contact with the SOT-MRAM cell stack, a write line disposed in electrical contact with the SHE rail, and a read line disposed above and adjacent to a cylindrical electrode of the cylindrical diode structure.

In one aspect, a spin-orbit torque magnetoresistive random-access memory device including a spin-Hall-effect (SHE) rail disposed in contact with a transistor, a spin-orbit-torque (SOT) magnetoresistive random access memory (MRAM) cell stack disposed above and in electrical contact with the SHE rail, wherein the SOT-MRAM cell stack comprises a free layer, a tunnel junction layer, and a reference layer, a cylindrical diode structure disposed above and in electrical contact with the SOT-MRAM cell stack, a write line disposed in electrical contact with the SHE rail, and a read line disposed above and adjacent to a cylindrical electrode of the cylindrical diode structure.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
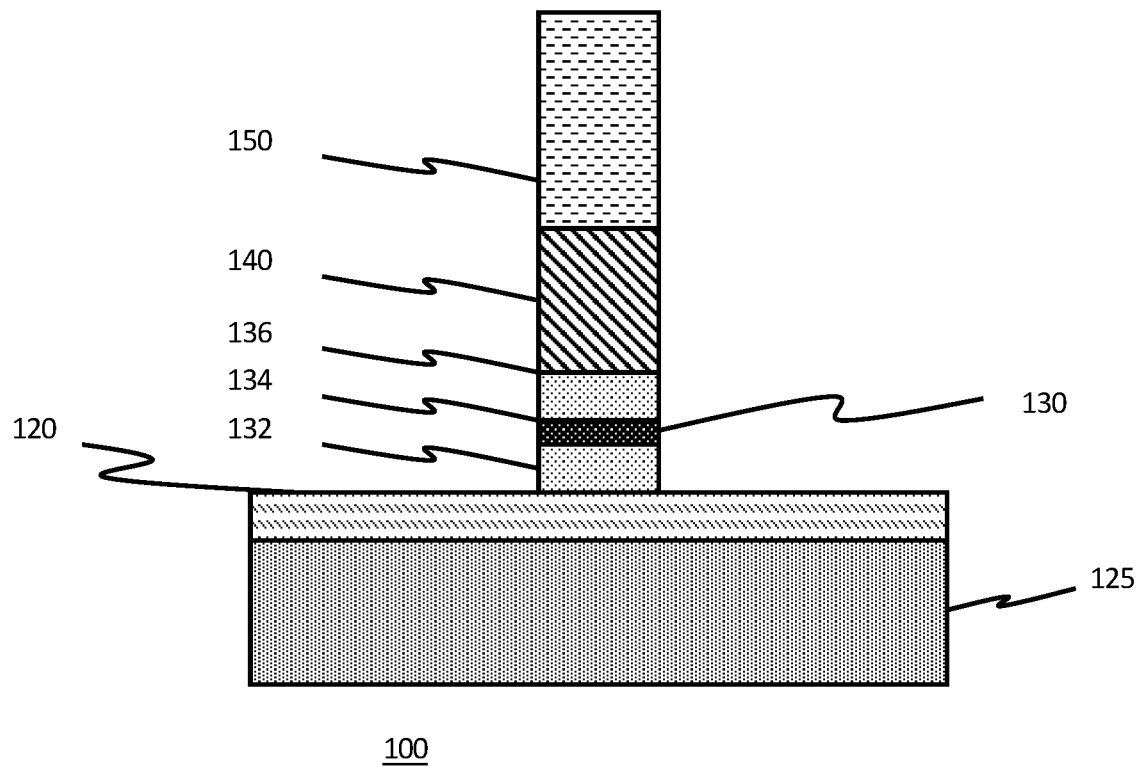
FIG. 1 provides a cross-sectional view of a step in the fabrication of a semiconductor device, according to an embodiment of the invention. The figure illustrates the MTJ including a top electrode and upper hard mask, as well as an SHE rail layer in contact with a bottom electrode and device transistor contact.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein can be interpreted accordingly. In addition, it should be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Spin-transfer torque (STT) magnetoresistive random-access memory (MRAM) passes current through the magnetic tunnel junction of the memory cell during each of the read and write operations. High write energies can reduce the longevity of the devices by degrading the device materials. Spin-orbit torque (SOT) MRAM devices resolve this issue by only passing relatively low read operation energies directly through the magnetic tunnel junction of the MRAM cell. The SOT, or spin Hall-effect (SHE) plate of the SOT MRAM cell must have a cross sectional area equal to or greater than the rest of the MRAM cell stack to effectively alter the free layer and write to the cell. Writing to a SOT MRAM cell does not require passing energy through the SOT MRAM cell stack. Typical SOT-MRAM cells structures include two transistors, one associated with writing a value to the cell and one associated with reading the value of the cell. Structures including two transistors require additional die area for each cell. Disclosed embodiments incorporate a cylindrical diode around the SOT-MRAM cell stack and enable the control of both read and write operations for the cell through a single transistor.

The use of a single transistor for each cell enables higher cell densities and supports additional integration of the device elements. The incorporation of a cylindrical diode formed around an upper electrode of the SOT-MRAM cell stack enables tuning of the diode voltage drop and current to suit the needs of the device circuitry. The voltage drop and current of the diode are tuned by altering the relative positioning of the cylindrical diode junction with regard to the interface between the upper SOT-MRAM electrode and an upper hard mask disposed above the upper electrode. The diode junction cylinder may be formed below the electrode—hard mask interface—completely in contact with the electrode, or across the electrode—hard mask interface, partially in contact with each of the hard mask and the electrode. The height, thickness, material, and location relative to the electrode-hard mask interface may be adjusted during fabrication to alter the diode voltage drop and current.

In an embodiment, a vertical SOT MRAM cell stack is etched from material layers deposited upon an underlying semiconductor device. Disclosed devices include SOT-MRAM cells in contact with a front-end-of-line transistor (not shown) by way of a common metal line (not shown), shared across rows of SOT-MRAM cells, and a bottom electrode (not shown) disposed upon the common metal line. Bottom electrodes may include TaN or TiN deposited by CVD, PVD or similar methods. In an embodiment, bottom electrodes are formed by masking and selective etching a layer of electrode material between about 1 nm and about 10 nm in thickness. After etching bottom electrodes, a dielectric layer is disposed around and above the bottom electrodes and then recessed to the upper surface of the bottom electrodes using chemical-mechanical planarization (CMP) processes to provide a polished flat surface for the next step.

As shown in FIG. 1, device 100 includes SHE layer 120 is disposed upon bottom electrodes (not shown) and dielectric material 125. In an embodiment, SHE layer 120 consists of one or more heavy, conductive metals such as $\beta$-Ta, $\beta$-W, $Cu_xPt_{1-x}$, $Cu_{1-x}Ta_x$, $Pd_xPt_{1-x}$, $Au_xPt_{1-x}$, Pt, $Bi_2Se_3$, $WTe_2$, $PtTe_2$, $TaS_2$, $Pt_xRh_{1-x}$, or any metallic alloy with average atomic weight above 80, or similar conductive metals and combinations thereof. In an embodiment, the SHE layer 120 has a thickness of between about 1 nm and about 50 nm. In an embodiment, SHE layer 120 consists of Bi2Se3. In an embodiment, SHE layer 120 consists of multiple layers of heavy metals such as Ta and Pt, deposited in succession. Deposition of the SHE layer 120 occurs by deposition processes including, e.g., chemical vapor deposition (CVD), physical vapor deposition (PVD), atomic layer deposition (ALD), or similar processes.

FIG. 1 illustrates the device after the deposition of a succession of material layers. The succession of layers form the SOT-MRAM cells including a magnetic tunnel junction (MTJ) an upper electrode, and an upper hard mask. As shown in FIG. 1, the layers for the MTJ stacks include a simplistically depicted MTJ 130 made of a free magnetic layer 132 (a layer having a switchable magnetic dipole moment), a tunnel barrier layer 134, and a reference magnetic layer 136 (a layer having a fixed magnetic dipole moment). The SOT-MRAM cell stack further includes upper electrode 140, and hard mask layer 150. In this embodiment, the MTJ 130 includes a seed layer (not shown) having free layer 132 grown thereon. The seed layer may include, for example, tantalum (Ta) or tantalum magnesium (TaMg) in some embodiments. The free layer 132 may include cobalt-iron-boron (CoFeB), for example. The respective layers may be formed by PVD. Next, a tunnel barrier layer 134 is formed on free layer 132. The tunnel barrier layer 134 may include a non-magnetic insulating material such as magnesium oxide (MgO). In an embodiment, tunnel barrier layer 134 is between about 0.3 nm and about 2 nm in thickness. Following the formation of the tunnel barrier layer 134, the reference layer 136 is formed on top of the tunnel barrier layer 134. The reference layer 136 may include, for example one or more interfacial layers, or spacers, and ruthenium, cobalt, palladium, tantalum, iron, boron, cobalt-platinum (Co|Pt) or cobalt-palladium (Co|Pd), in multilayers or a mixture. In an embodiment, reference layer 136 is between about 3 nm and about 10 nm in thickness. The respective layers may be formed by PVD. The free layer 132 and the reference layer 136 have perpendicular magnetic anisotropies.

Upper electrode layer 140 may comprise TiN, TaN, W, or other conductive metals or alloys. Hard mask layer 150 may comprise SiN, SiOx, $Si_xB_yC_zN_t$, etc. In an embodiment, the hard mask layer 150 consists of TaN or TiN deposited by CVD or PVD to a thickness of between about 20 nm and about 60 nm. In an embodiment, hard mask layer 150 consists of a nitride, oxide, an oxide-nitride bilayer, or another suitable material. In some embodiments, the hard mask layer 150 may include an oxide such as silicon oxide (SiO), a nitride such as silicon nitride (SiN), an oxynitride such as silicon oxynitride (SiON), combinations thereof, etc. In some embodiments, the hard mask layer 150 is a silicon nitride such as $Si_3N_4$.

FIG. 1 illustrates device 100 after deposition of and patterned etching of the MTJ 130, upper electrode 140, and dielectric hard mask 150, from a stack of layers of the relevant materials sequentially deposited across the surface of the device die. Patterned lithography may be used to mask the stacked layers prior to the application of selective etching such as reactive ion beam etching, to remove the unmasked portions of the layers. Selective etching stops at the upper surface of the SHE rail layer 120.

Figure 2:
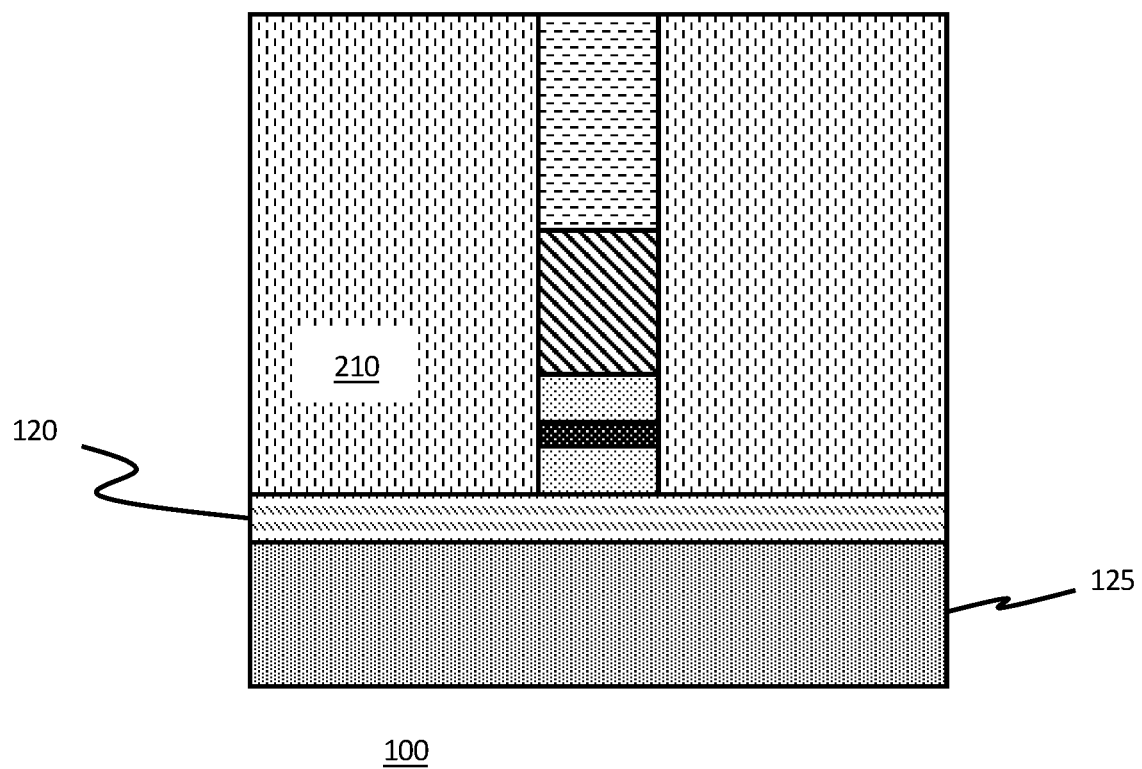
FIG. 2 provides a cross-sectional view of a step in the fabrication of a semiconductor device, according to an embodiment of the invention. The figure illustrates the device after encapsulation of the MTJ stack, upper electrode and hard mask.

FIG. 2 illustrates device 100 after the deposition of an encapsulating dielectric material layer 210, such as SiN, SiOx, $Si_xB_yC_zN_t$, etc., around the SOT-MRAM cell stack, followed by CMP processes to recess the dielectric material to the upper surface of the hard mask layer 150. The CMP processes yielding a polished upper surface in preparation for the next fabrication steps.

Figure 3:
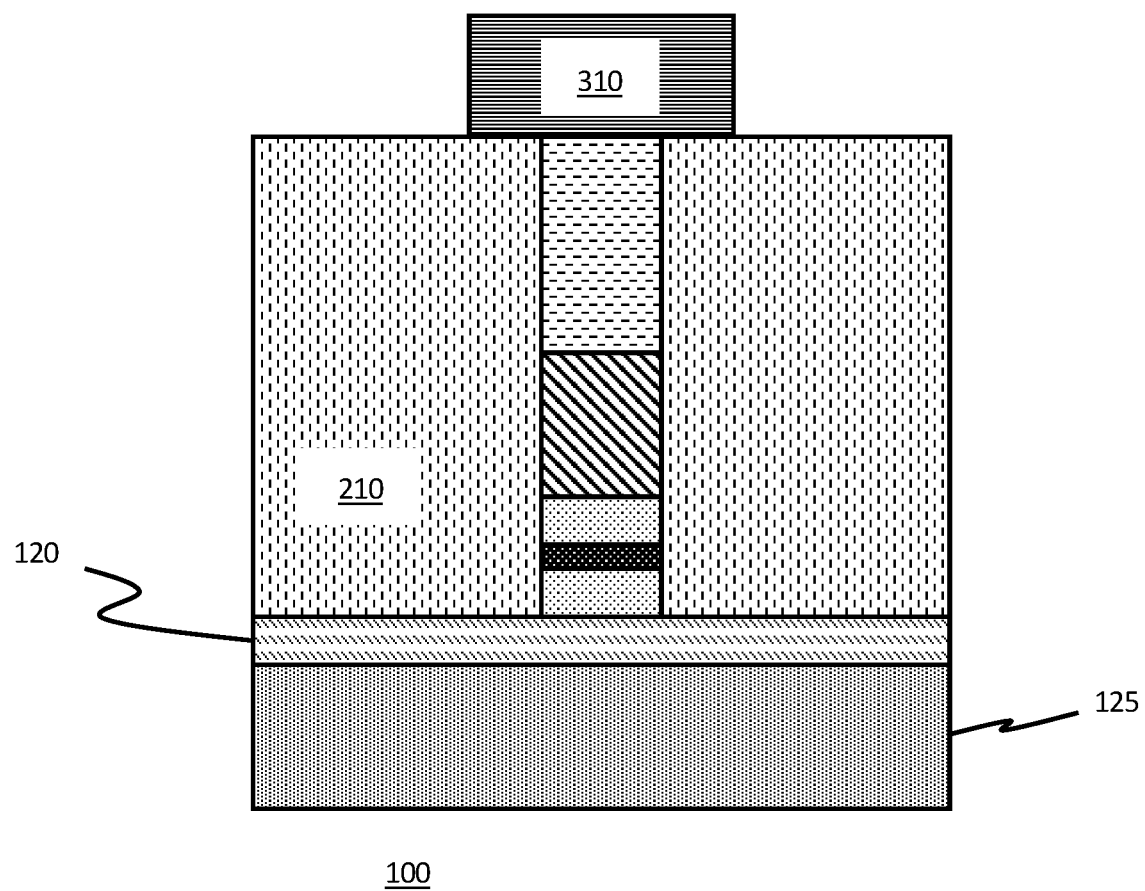
FIG. 3 provides a cross-sectional view of a step in the fabrication of a semiconductor device, according to an embodiment of the invention. The figure illustrates the device after the addition of a patterned hard mask.

FIG. 3 illustrates device 100 after the deposition, lithographic masking and selective removal of a SHE rail mask 310, such as an organic planarization layer (OPL), or a hard mask layer (TiN, TaN, etc.). Patterned mask 310 provides the desired cross-section for the SHE rail formed from SHE layer 120.

Figure 4:
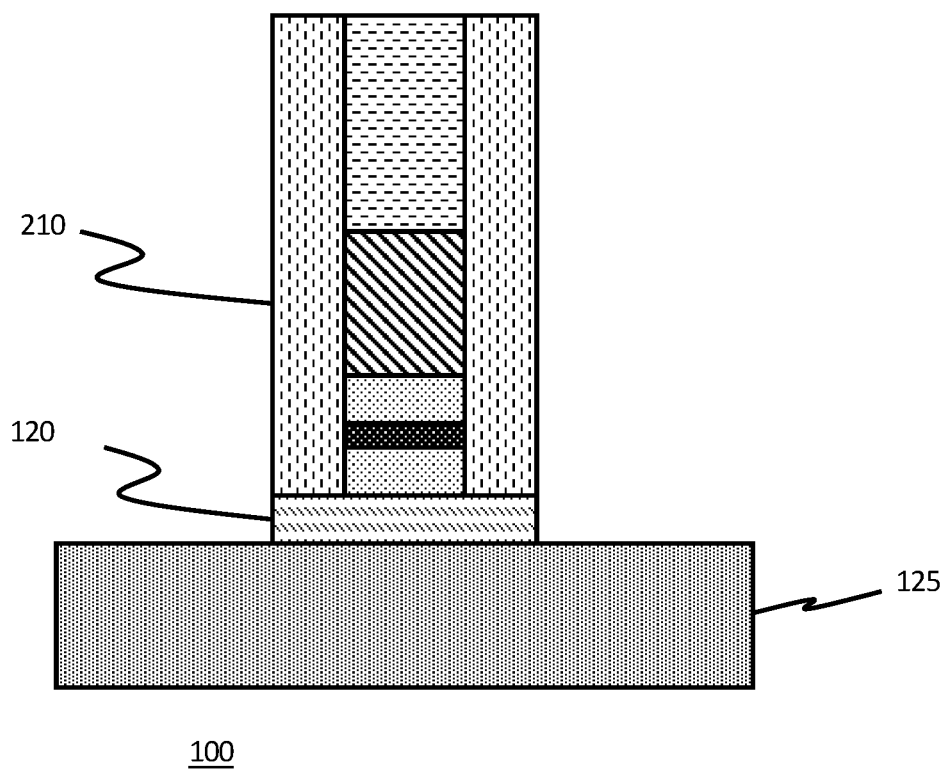
FIG. 4 provides a cross-sectional view of a step in the fabrication of a semiconductor device, according to an embodiment of the invention. The figure illustrates the device after the patterned etching of SHE rail.

FIG. 4 illustrates device 100 after selective removal of encapsulating dielectric material 210, portions of SHE layer 120, and patterned mask 310. Reactive ion etching may be used in the removal of the materials.

Figure 5:
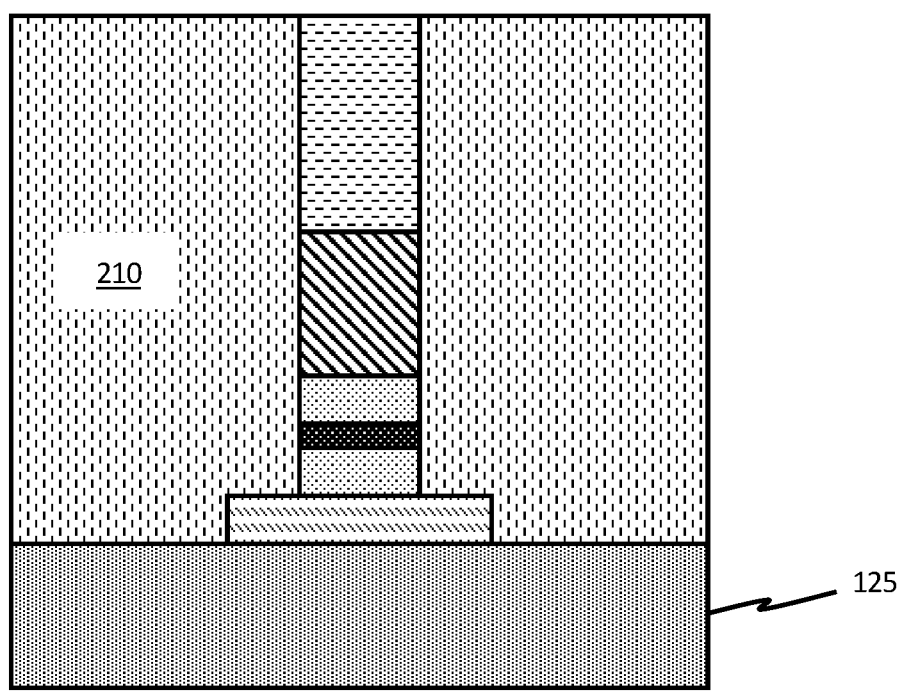
FIG. 5 provides a cross-sectional view of a step in the fabrication of a semiconductor device, according to an embodiment of the invention. The figure illustrates the device after the encapsulation of the SHE rail.

FIG. 5 illustrates device 100 after deposition and CMP of additional protective dielectric 210, to the upper surface of hard mask 150.

Figure 6:
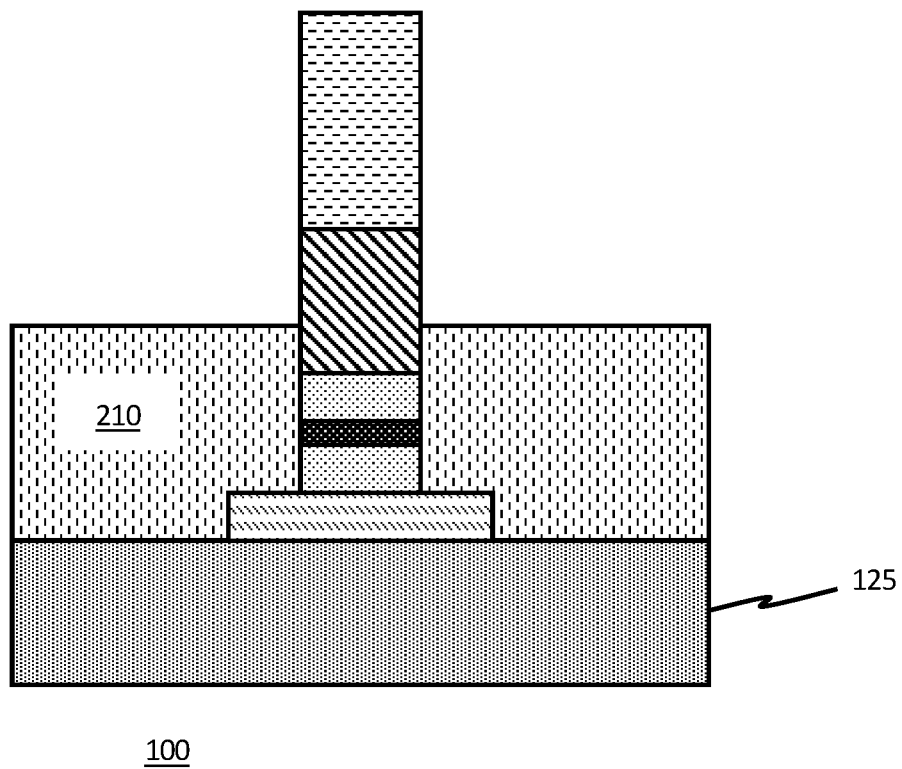
FIG. 6 provides a cross-sectional view of a step in the fabrication of a semiconductor device, according to an embodiment of the invention. The figure illustrates the device after selective etching to expose the SOT-MRAM stack upper electrode.

FIG. 6 illustrates device 100 after selective removal of portions of dielectric material 210, using RIE, wet etching of other selective etching methods, to expose hard mask 150 and a portion of upper electrode 140 of the SOT-MRAM cell stack.

Figure 7:
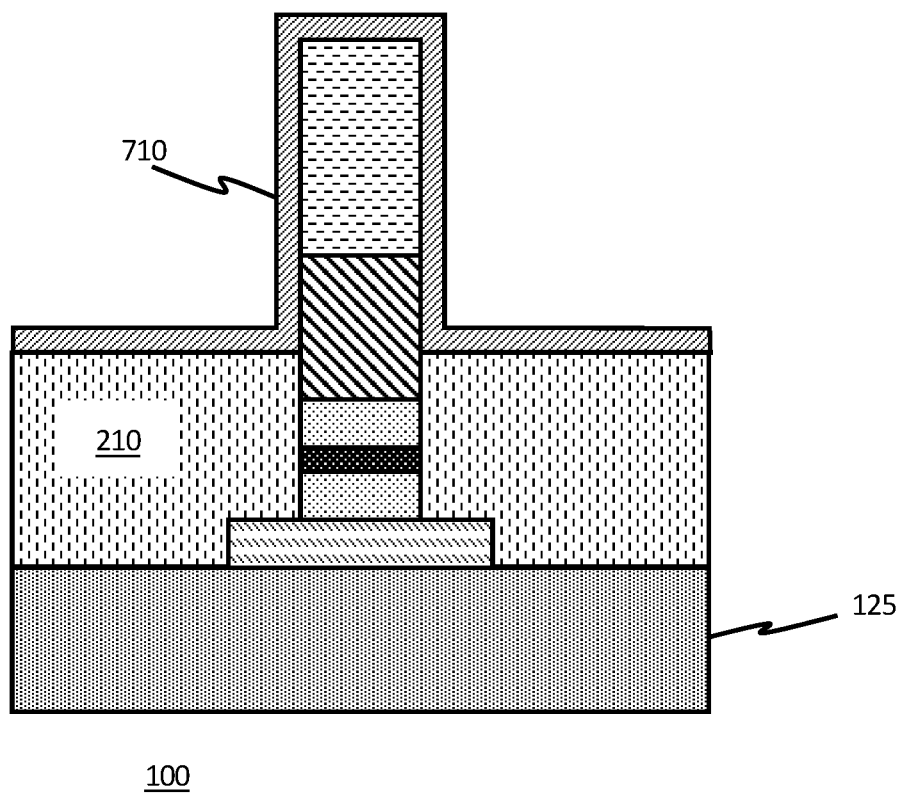
FIG. 7 provides a cross-sectional view of a step in the fabrication of a semiconductor device, according to an embodiment of the invention. The figure illustrates the device after deposition of the diode junction layer.

FIG. 7 illustrates device 100 after deposition of diode junction material(s) 710, such as 2D materials including WSe, SnSe2, graphene, etc., poly-Ge (P/N) (deposited at low-temperatures and laser annealed), and a sequence of W/TiOx/Ni layers forming a Schottky diode. Conformal deposition of the diode junction necessitate removal of the junction material(s) from horizontal device surfaces. Process temperatures below about 420 C enable deposition of the diode junction materials 710. Such process temperatures are compatible with the front-end-of-line and back-end-of-line processes utilized in the overall fabrication of associated devices, enabling the addition of diodes and disclosed MRAM circuits to such devices.

Figure 8:
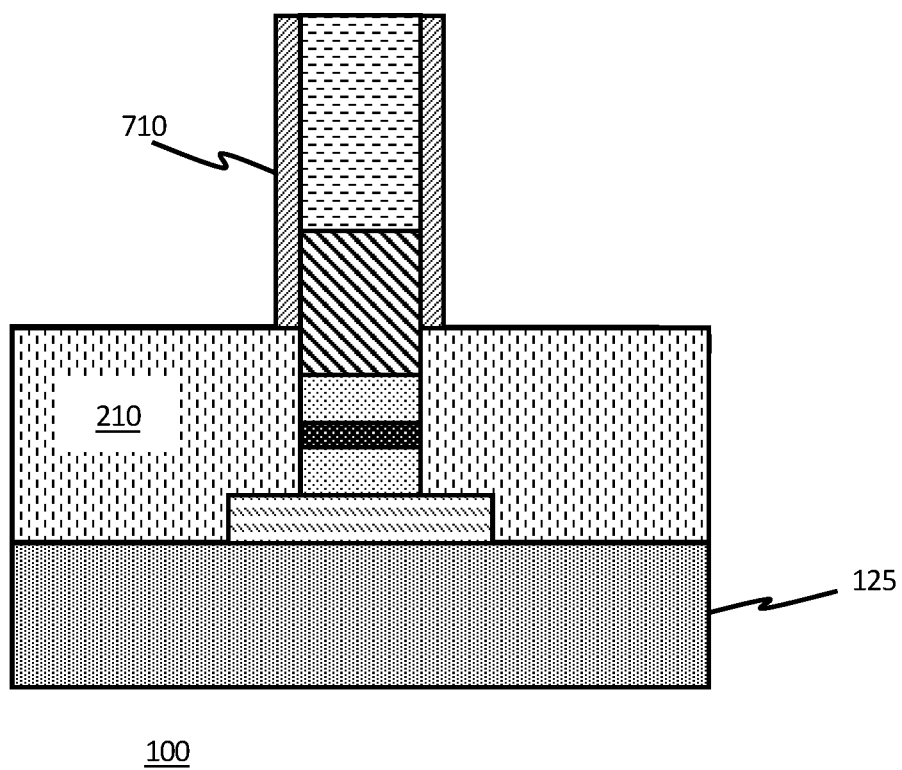
FIG. 8 provides a cross-sectional view of a step in the fabrication of a semiconductor device, according to an embodiment of the invention. The figure illustrates the device after selective etching of the diode junction layer.

FIG. 8 illustrates device 100 following selective removal of diode junction material(s) 710, from horizontal surfaces by way of RIE, anisotropic etching, or other selective etching methods.

Figure 9:
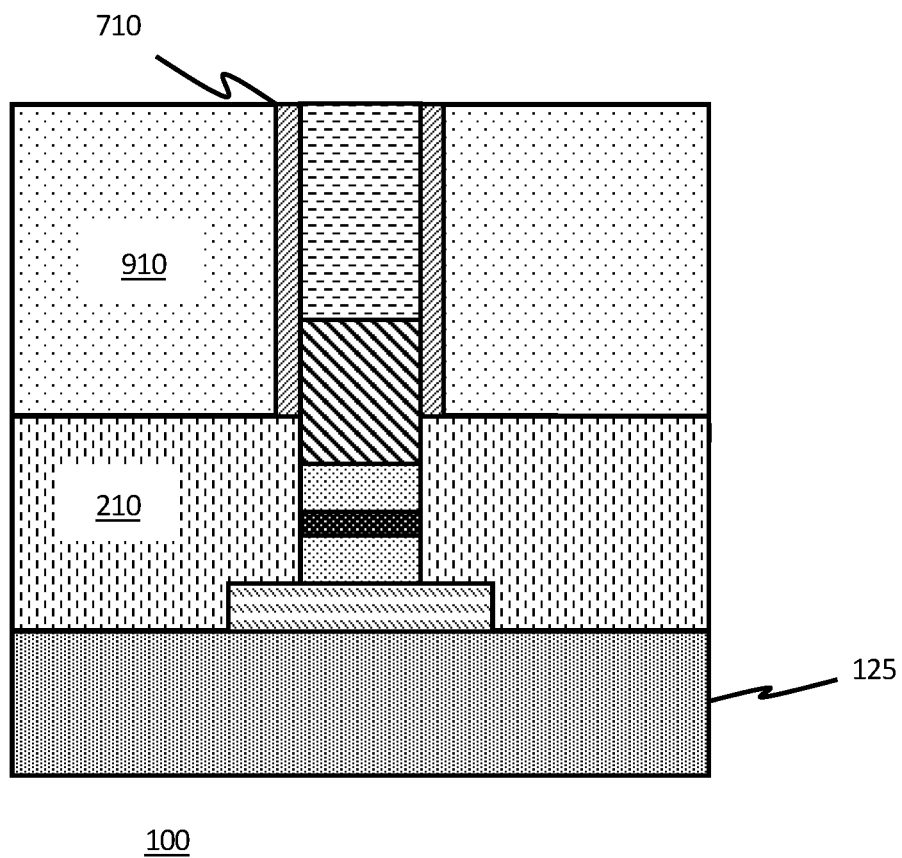
FIG. 9 provides a cross-sectional view of a step in the fabrication of a semiconductor device, according to an embodiment of the invention. The figure illustrates the device after encapsulation of the diode junction layer.

FIG. 9 illustrates device 100 following encapsulation of the cylindrical diode junction 710 by a layer of dielectric material 910, such as SiOx, SiON, etc., and CMP of the encapsulating layer to the upper surface of hard mask 150.

Figure 10:
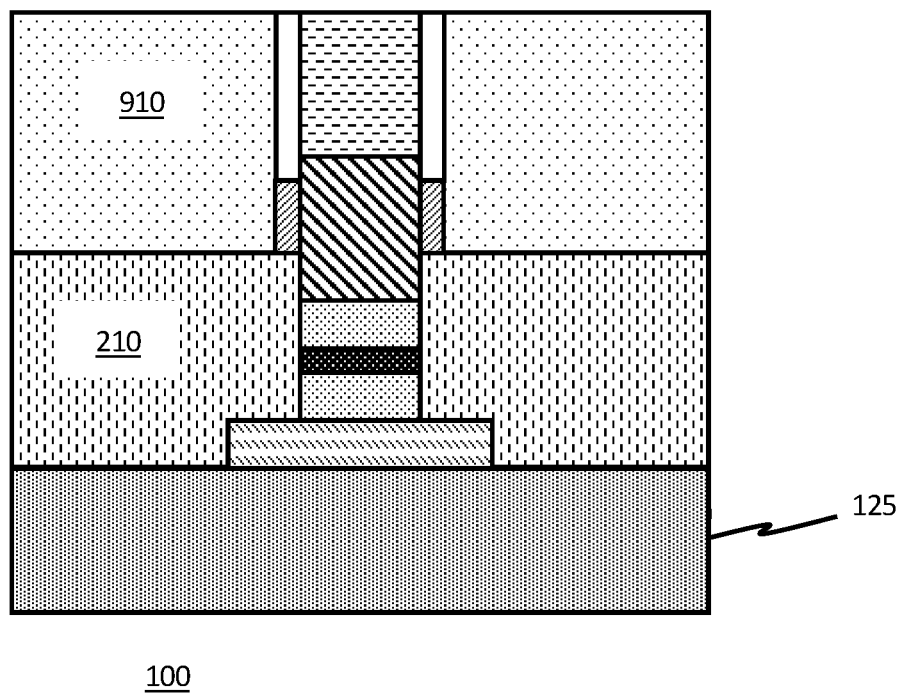
FIG. 10 provides a cross-sectional view of a step in the fabrication of a semiconductor device, according to an embodiment of the invention. The figure illustrates the device after recessing the diode junction layer.

FIG. 10 illustrates device 100 following selective removal and recessing of diode junction material 710 to a desired level. The desired level may be above or below the upper electrode 140-hard mask 150 interface. The voltage drop and current across the diode may be tuned using the selected level for the upper surface of diode junction 710 relative to the upper-electrode 140-hard mask 150 interface, and the overall height and thickness of the cylindrical diode junction element 710.

The height of the recessed element 710 (diode material) modulates the diode area. The magnitude of the diode's current is proportional to its area and can be tuned by the height of recessed element 710. There is an optimized design point for diode current depending on the material being used for element 710. Generally, a larger diode area will lower the voltage drop needed for read operation. On the other hand, during the write operation, where the diode is reverse biased, the leakage of the current becomes important. Diodes having a very large area also have a large leakage current density. The total diode leakage current may interfere with the write operation. Tuning the diode voltage drop and current enables balancing the needs associated with read operation voltage drop and write operation current leakage.

Figure 11:
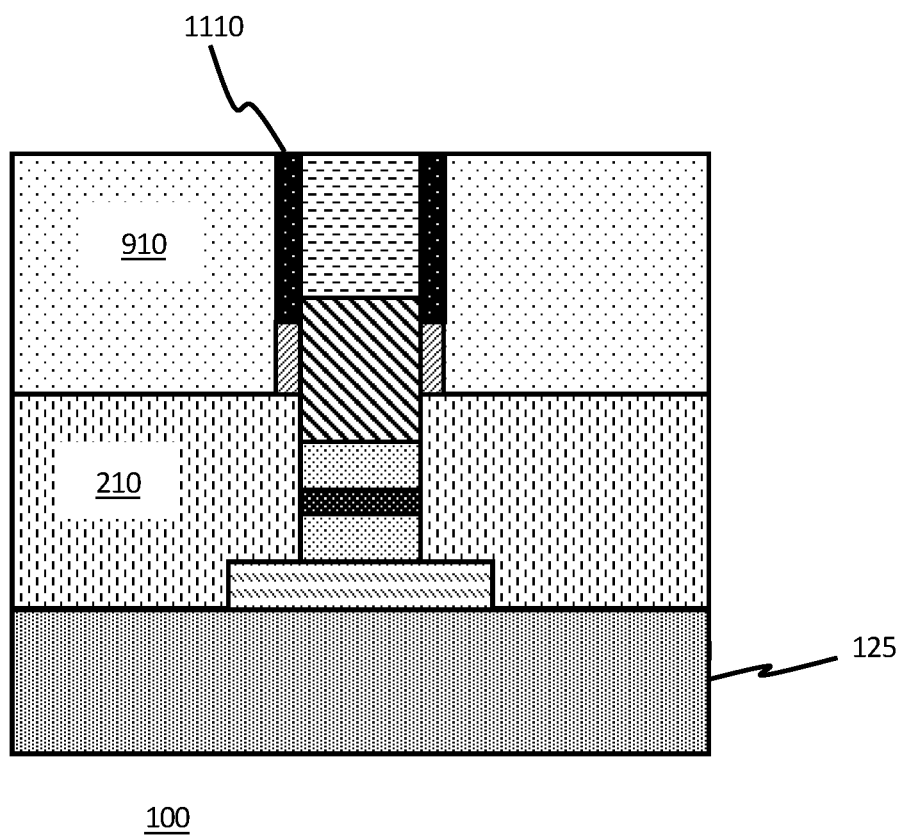
FIG. 11 provides a cross-sectional view of a step in the fabrication of a semiconductor device, according to an embodiment of the invention. The figure illustrates the device after deposition of a dielectric fill material above the diode junction layer.

FIG. 11 illustrates device 100 following backfilling the cavity surrounding hard mask 150 and upper electrode 140 with a protective dielectric 1110 such as SiN. CMP processes recess and polish the dielectric to the desired upper surface level of the hard mask 150.

Figure 12:
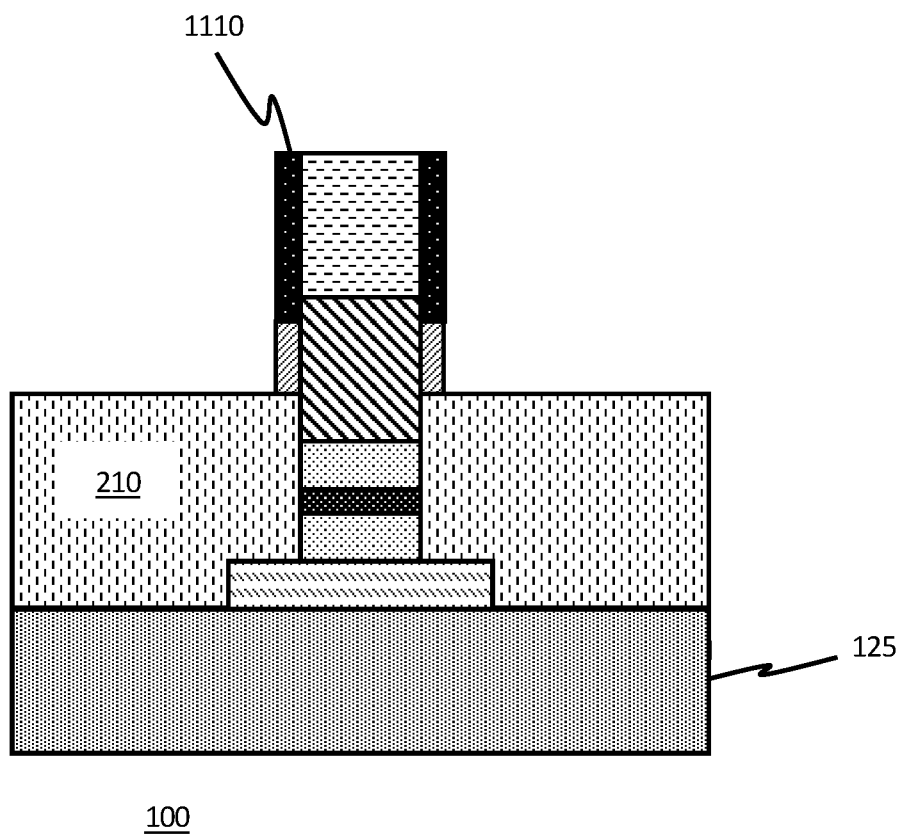
FIG. 12 provides a cross-sectional view of a step in the fabrication of a semiconductor device, according to an embodiment of the invention. The figure illustrates the device after selective etching of the encapsulation layer.

FIG. 12 illustrates device 100 following selective removal of protective dielectric material 910, through RIE or other etching processes, thereby exposing cylindrical diode junction 710 and protective dielectric 1110.

Figure 13:
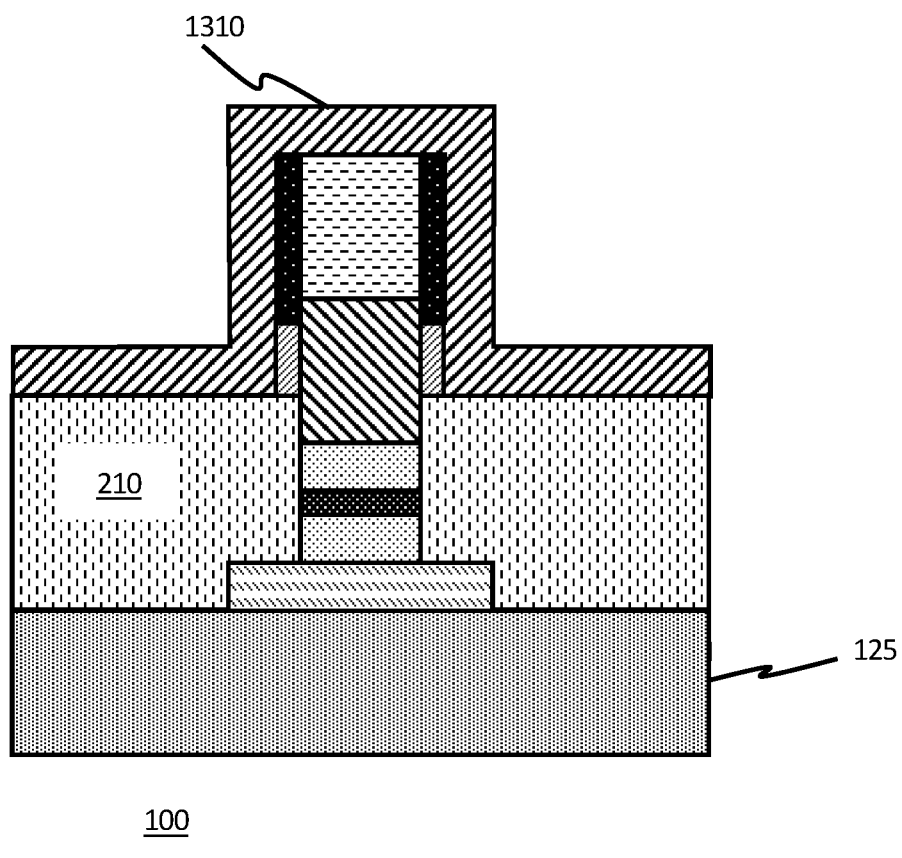
FIG. 13 provides a cross-sectional view of a step in the fabrication of a semiconductor device, according to an embodiment of the invention. The figure illustrates the device after deposition of the outer cylindrical diode electrode layer.

FIG. 13 illustrates device 100 following conformal deposition of outer diode electrode material 1310, such as Ti, TiN, Ta, TaN, Ru, W, or any combination thereof. In an embodiment, the outer diode electrode comprises a thickness of between about 2 nm and about 50 nm. In an embodiment, the outer diode electrode comprises a thickness of between about 5 nm and about 20 nm. Conformal deposition yields electrode material upon the horizontal and vertical surfaces of device 100.

Figure 14:
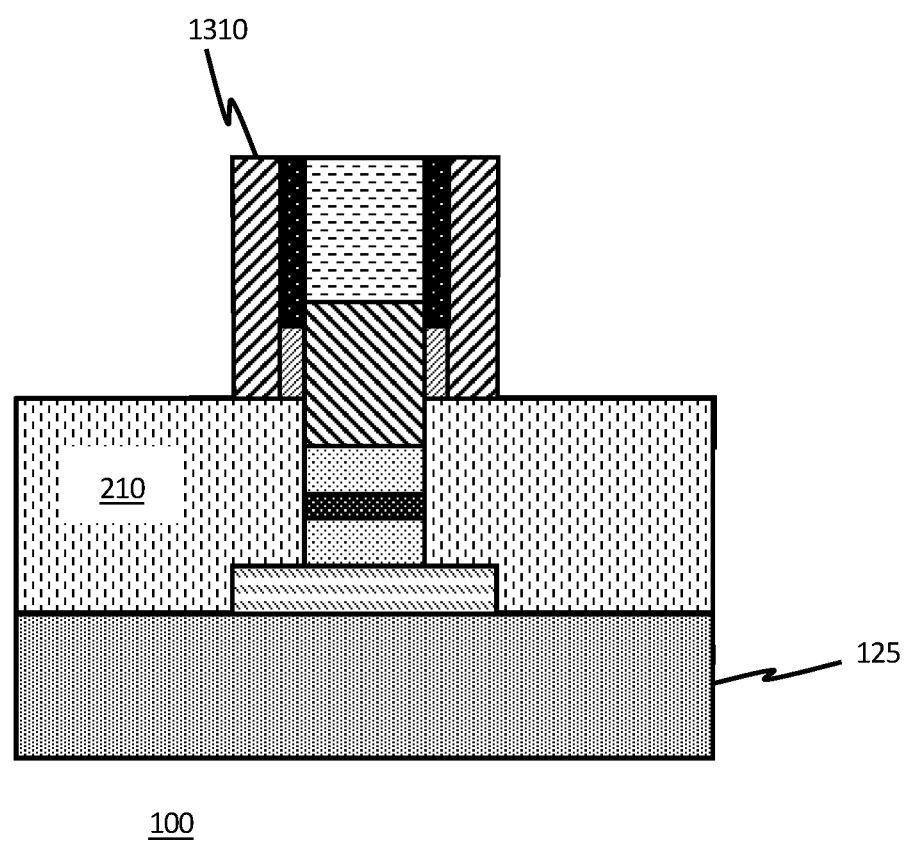
FIG. 14 provides a cross-sectional view of a step in the fabrication of a semiconductor device, according to an embodiment of the invention. The figure illustrates the device after formation of the outer cylindrical diode electrode.

FIG. 14 illustrates device 100 following selective removal of electrode material 1310 from horizontal surfaces of the device through selective etching such as RIE, anisotropic etching, or other methods. Selective removal of electrode material 1310 yields exposure of the upper surface of hard mask 150 as well as a horizontal upper surface of cylindrical outer diode electrode 1310.

Figure 15:
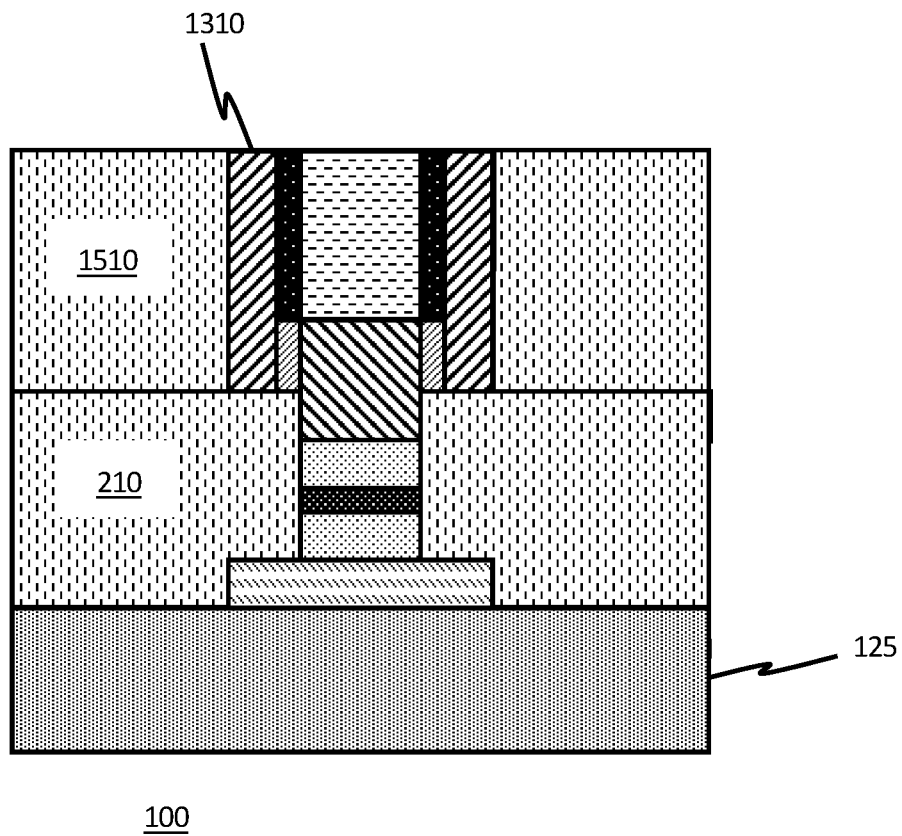
FIG. 15 provides a cross-sectional view of a step in the fabrication of a semiconductor device, according to an embodiment of the invention. The figure illustrates the device after encapsulation of the outer cylindrical diode electrode.

FIG. 15 illustrates device 100 following encapsulation of the SOT-MRAM cell, including the upper cylindrical diode with a protective dielectric material 1510, such as SiN, SiOx, $Si_xB_yC_zN_t$, etc., and CMP of the device to the level of hard mask 150 and cylindrical outer diode electrode 1310, to provide polished surface for the next stage of fabrication.

Figure 16:
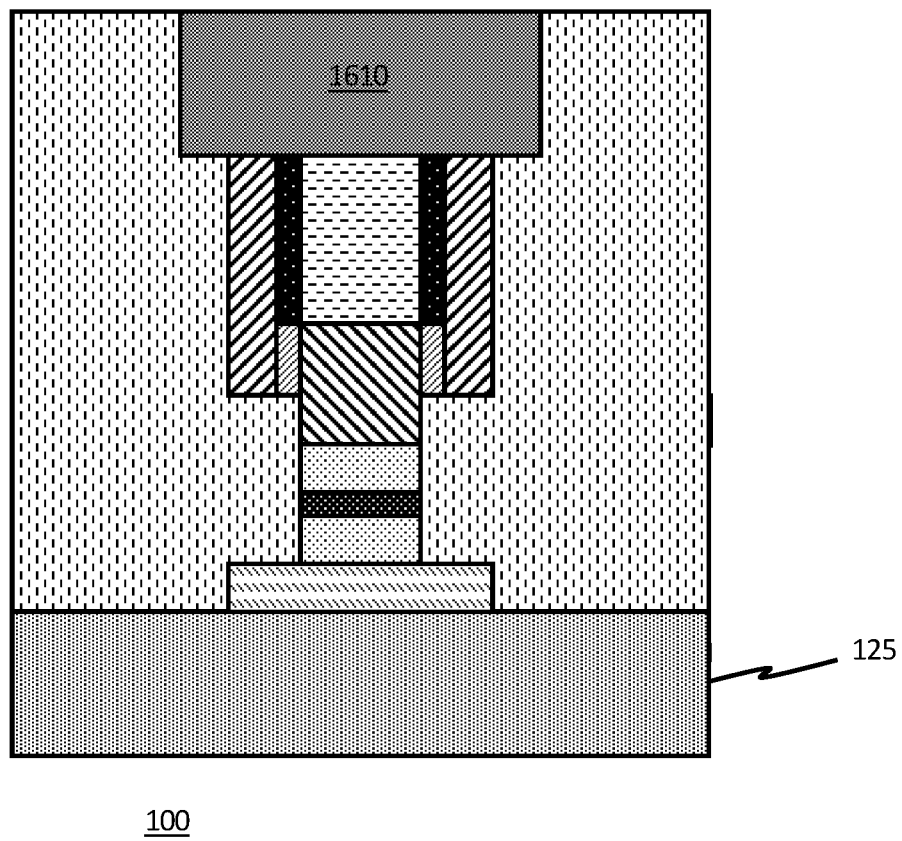
FIG. 16 provides a cross-sectional view of a step in the fabrication of a semiconductor device, according to an embodiment of the invention. The figure illustrates the device after deposition of the upper read electrode for the SOT-MRAM cell.

FIG. 16 illustrate device 100 following fabrication of upper read electrode 1610 in contact with the cylindrical outer diode electrode 1310. A metal layer is deposited across the surface of device 100 and then selectively etched using lithographic masking and selective etching to yield patterned read electrodes 1610 in contact with the cylindrical outer electrodes 1310 of the respective SOT-MRAM cells of device 100. Deposition and CMP of additional protective dielectric materials such as SiN, SiOx, $Si_xB_yC_zN_t$, etc., followed by CP process to the level of read electrode 1610 completes the stages of fabrication associated with the SOT-MRAM cells including cylindrical diodes.

Reading a SOT-MRAM cell comprises applying a known voltage across the diode and the cell stack, between the read electrode and the ground through the transistor and measuring the current through the stack. The resistance of the stack is determined from the voltage and current. The resistance indicates either a cell value of "0", or "1".

Each cell has two write commands. A first write command applies a negative voltage across the SHE rail of the cell, between the transistor and the write electrode, this write command switches the free layer of the SOT-MRAM from a parallel state to a antiparallel state with regard to the reference layer of the stack. The second write command applies a positive voltage across the SHE rail of the cell, between the transistor and the write electrode, this write command switches the free layer of the SOT-MRAM from an antiparallel state to a parallel state with regard to the reference layer of the stack.

Incorporating a diode in the SOT-MRAM cell stack limits the direction of current flow through the stack to the direction from the read electrode, through the stack to the ground through the transistor. This limitation enables control of both write commands and the read command for the cell through a single transistor. The location, junction material, junction height and thickness, of the cylindrical diode of disclosed embodiments may be altered to tune the voltage drops and currents across the diodes of the SOT-MRAM cells.

Figure 17:
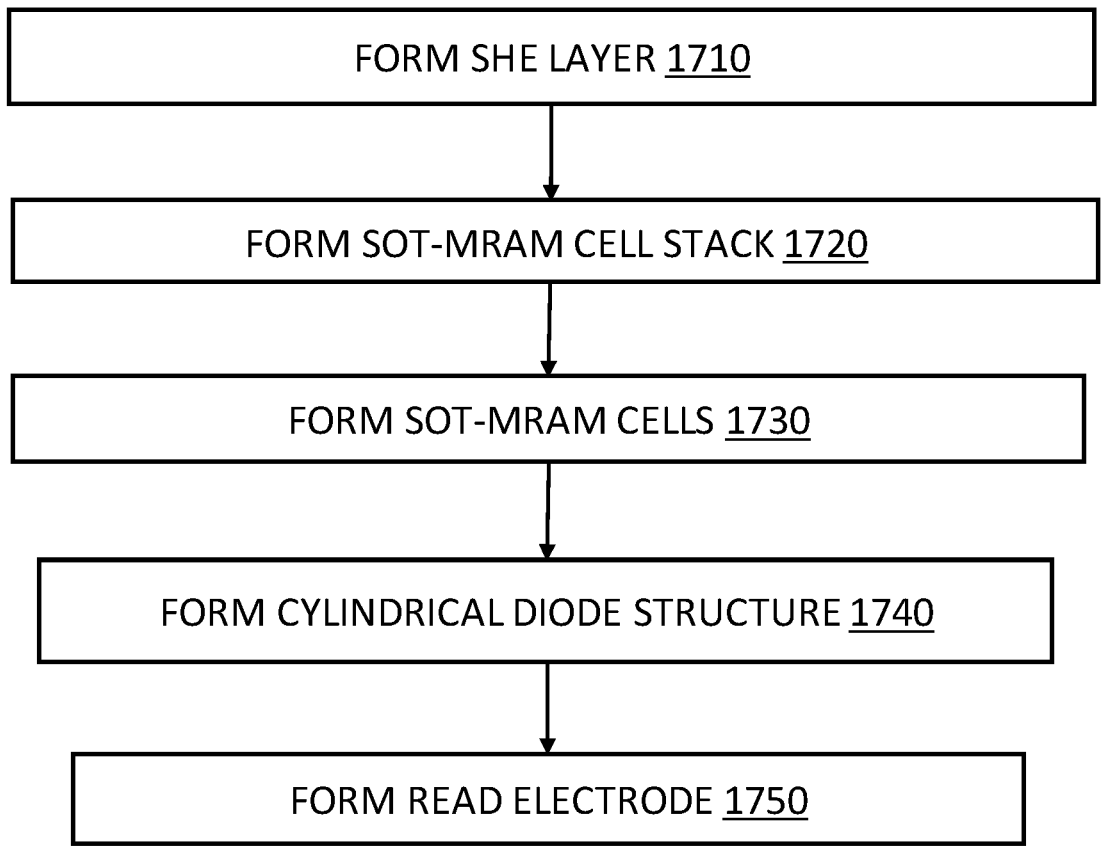
FIG. 17 provides a flowchart depicting operational steps for forming semiconductor device, according to an embodiment of the invention.

FIG. 17 provides a flowchart 1700 depicting operational steps associated with the fabrication of the disclosed SOT MRAM devices. According to the figure, at block 1710, a spin-Hall-Effect (SHE) layer is formed upon an underlying semiconductor device, in contact with a transistor of the underlying device. The SHE layer includes a conductive metal layer deposited upon the underlying semiconductor device and selectively patterned and etched. The Underlying semiconductor device includes transistors ultimately used to control read and write operations of the SOT MRAM cells. The upper surface of the underlying semiconductor device includes exposed metal contacts of the respective device transistors.

At block 1720, the SOT MRAM cell stack is formed. The stack includes a succession of material layers, a free layer in contact with the SHE layer and having a switchable magnetic dipole moment, a tunneling junction layer, a reference layer having a fixed magnetic dipole moment, an upper electrode layer for the SOT-MRAM cells, and a protective hard mask material layer. Each layer is formed across the entire cross section of the device.

At block 1730 the hard mask layer is then patterned and selectively etched to form an array of hard mask portions in the pattern of the desired array of SOT-MRAM cells of the device The remaining SOT-MRAM cell stack layers are then selectively etched back leaving the SOT MRAM stack in contact with the SHE rail.

At block 1740 a cylindrical diode structure is formed around the SOT-MRAM cell/hard mask combination. The diode structure includes a diode junction formed around and in contact with at least the upper electrode of the SOT-MRAM. The junction material may also be disposed in contact with the hard mask. The diode structure includes an outer electrode in contact with the diode junction material. The fabrication step temperatures necessary for the formation of the cylindrical diode range below about 420 C. The temperatures are compatible with front-end-of-line and back-end-of-line fabrication processes.

At block 1750 the read electrode for the SOT-MRAM cell is formed from a metallic layer deposited over the hard mask and outer electrode of the diode structure. The layer is patterned and selectively etched yielding upper read electrodes in contact with the upper layers of the diode stacks of the array of SOT-MRAM cells. The read electrode is then encapsulated in a protective inter layer dielectric material.

In an embodiment, upper write electrodes are formed in contact with the SHE rails of the SOT-MRAM cells. In this embodiment, vias are formed through the ILD material described for block 1750. The vias expose portions of the SHE rails of the SOT-MRAM cells. The vias are filled with conductive material and CMP processes yield a common polished surface including the upper surface of the SOT-MRAM cell diode stacks as well as the upper surface of the material in the write electrode via. Upper read and write electrodes for each SOT-MRAM cell are then formed from a common metal layer as described for block 1750.

In an embodiment, the SHE layer is formed in contact with the transistor as described above and further in contact with a lower write electrode formed as part of the underlying semiconductor device.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An MRAM (magnetoresistive random-access memory) structure comprising:
   a spin-Hall-effect (SHE) rail;
   a spin-orbit-torque (SOT) magnetoresistive random access memory (MRAM) cell stack disposed above and in electrical contact with the SHE rail,
   a cylindrical diode structure disposed above and in electrical contact with a SOT-MRAM stack upper electrode;
   a write line disposed in electrical contact with the SHE rail; and
   a read line disposed above and adjacent to an outer cylindrical shell of the diode structure.

2. The MRAM structure according to claim 1, wherein the SHE rail is disposed in electrical contact with a transistor.

3. The MRAM structure according to claim 1, wherein the diode structure comprises an inner cylindrical electrode, a cylindrical junction layer surrounding the inner cylindrical electrode, and a cylindrical outer electrode structure.

4. The MRAM structure according to claim 1, wherein the free layer is disposed adjacent to the SHE rail.

5. The MRAM structure according to claim 1, wherein the diode structure is disposed in contact with an SOT-MRAM stack upper hard mask.

6. The MRAM structure according to claim 1, wherein the diode structure includes a material structure selected from the group consisting of: 2D materials, poly-Ge materials, and a metal-oxide/metal Schottky diode.

7. The MRAM structure according to claim 1, wherein the SHE rail comprises a material selected from the group consisting of Ta, Pt, W, Ir, and combinations thereof.

8. The MRAM structure according to claim 1, further comprising a hard mask spacer disposed between the diode structure and the read line.

9. An MRAM (magnetoresistive random-access memory) structure comprising:
   a spin-Hall-effect (SHE) rail disposed in electrical contact with a transistor;
   a spin-orbit-torque (SOT) magnetoresistive random access memory (MRAM) cell stack disposed above and in electrical contact with the SHE rail,
   a cylindrical diode structure disposed above and in electrical contact with a SOT-MRAM stack upper electrode;
   a write line disposed in electrical contact with the SHE rail; and
   a read line disposed above and adjacent to an outer cylindrical shell of the diode structure.

10. The MRAM structure according to claim 9, wherein the read line is in electrical connection with a ground through the transistor.

11. The MRAM structure according to claim 9, wherein the diode structure comprises an inner cylindrical electrode, a cylindrical junction layer surrounding the inner cylindrical electrode, and a cylindrical outer electrode structure surrounding the cylindrical junction layer.

12. The MRAM structure according to claim 9, wherein the free layer is disposed adjacent to the SHE rail.

13. The MRAM structure according to claim 9, wherein the diode structure is disposed in contact with an SOT-MRAM stack upper hard mask.

14. The MRAM structure according to claim 9, wherein the diode structure includes a material structure selected from the group consisting of: 2D materials, poly-Ge materials, and a metal-oxide/metal Schottky diode.

15. The MRAM structure according to claim 9, wherein the SHE rail comprises a material selected from the group consisting of Ta, Pt, W, Ir, and combinations thereof.

16. The MRAM structure according to claim 9, further comprising a hard mask spacer disposed between the diode structure and the read line.

17. A method of fabricating a semiconductor device, the method comprising:
   forming a spin-Hall-effect (SHE) layer above and in electrical contact with a transistor;
   forming a spin-orbit-torque (SOT) magnetoresistive random access memory (MRAM) cell stack disposed above and in electrical contact with the SHE rail, wherein the SOT-MRAM cell stack comprises a free layer, a tunnel junction layer, and a reference layer;
   forming a cylindrical diode structure above and in electrical contact with the SOT-MRAM cell stack;
   forming a write line disposed in electrical contact with the SHE rail; and
   forming a read line disposed above and adjacent to an outer cylindrical electrode of the diode structure.

18. The method of fabricating a semiconductor structure according to claim 17, wherein diode structure selected from the group consisting of: 2D materials, poly-Ge materials, and a metal-oxide/metal Schottky diode.

19. The method of fabricating a semiconductor structure according to claim 17, wherein forming the cylindrical diode structure comprises forming the cylindrical diode structure at temperatures below about 420 C.

20. The method of fabricating a semiconductor structure according to claim 17, wherein the diode structure comprises an inner cylindrical electrode, a cylindrical junction layer surrounding the inner cylindrical electrode, and a cylindrical outer electrode structure surrounding the cylindrical junction layer.

* * * * *